United States Patent
Nomura et al.

(10) Patent No.: US 10,755,998 B2
(45) Date of Patent: Aug. 25, 2020

(54) METAL MEMBER, COMPOSITE OF METAL MEMBER AND RESIN MEMBER, AND PRODUCTION METHOD THEREFOR

(71) Applicant: DENSO CORPORATION, Kariya, Aichi-pref. (JP)

(72) Inventors: Takumi Nomura, Kariya (JP); Wataru Kobayashi, Kariya (JP); Kazuki Koda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/296,868

(22) Filed: Mar. 8, 2019

(65) Prior Publication Data
US 2019/0206761 A1   Jul. 4, 2019

Related U.S. Application Data

(63) Continuation of application No. PCT/JP2017/039796, filed on Nov. 2, 2017.

(30) Foreign Application Priority Data

Nov. 15, 2016  (JP) .................................. 2016-222542

(51) Int. Cl.
| | |
|---|---|
| H01L 23/10 | (2006.01) |
| H01L 23/34 | (2006.01) |
| H01L 23/367 | (2006.01) |
| H01L 23/13 | (2006.01) |
| H01L 21/48 | (2006.01) |
| H01L 23/29 | (2006.01) |
| H01L 23/31 | (2006.01) |

(Continued)

(52) U.S. Cl.
CPC .......... H01L 23/3672 (2013.01); B29C 65/00 (2013.01); B29C 65/70 (2013.01); C23F 4/02 (2013.01); F28F 3/02 (2013.01); H01L 21/4871 (2013.01); H01L 21/565 (2013.01); H01L 23/13 (2013.01); H01L 23/293 (2013.01); H01L 23/3121 (2013.01); H01L 23/3736 (2013.01); H01L 23/42 (2013.01); H05K 7/209 (2013.01); B23K 26/354 (2015.10); B23K 26/362 (2013.01); B29K 2705/02 (2013.01)

(58) Field of Classification Search
CPC ....... H01L 2224/48091; H01L 23/4332; H01L 2224/32245; H01L 24/29; H01L 21/02203; H01L 2224/3207; H01L 2224/81345; H01L 2224/83345; H01L 33/22; H01L 23/3736; H01L 23/13
USPC .......... 257/739, 740; 438/628, 644, 654, 665
See application file for complete search history.

(56) References Cited

U.S. PATENT DOCUMENTS

| | | | | |
|---|---|---|---|---|
| 4,937,653 | A * | 6/1990 | Blonder | ................ H01L 23/13 |
| | | | | 257/739 |
| 8,436,431 | B2 * | 5/2013 | Takemura | ........... H01L 29/4908 |
| | | | | 257/412 |

(Continued)

Primary Examiner — S. V. Clark
(74) Attorney, Agent, or Firm — Posz Law Group, PLC

(57) ABSTRACT

A metal member includes a metal substrate and a porous metal layer. A composite includes the metal member and a resin member. The metal substrate has one surface, is made of a metal material, and has a region formed as an uneven layer having an uneven shape with respect to the one surface. The porous metal layer has a mesh-like shape and is formed on the uneven layer. The uneven layer includes a plurality of protrusions protruding in a direction normal to the one surface.

14 Claims, 6 Drawing Sheets

(51) Int. Cl.
  *H01L 21/56*   (2006.01)
  *H05K 7/20*    (2006.01)
  *F28F 3/02*    (2006.01)
  *B29C 65/70*   (2006.01)
  *H01L 23/373*  (2006.01)
  *C23F 4/02*    (2006.01)
  *H01L 23/42*   (2006.01)
  *B29C 65/00*   (2006.01)
  *B29K 705/02*  (2006.01)
  *B23K 26/354*  (2014.01)
  *B23K 26/362*  (2014.01)

(56) References Cited

U.S. PATENT DOCUMENTS

| | | | |
|---|---|---|---|
| 2002/0100988 A1* | 8/2002 | Shimada | H01L 24/81 |
| | | | 257/781 |
| 2005/0124113 A1* | 6/2005 | Yoneda | H01L 28/84 |
| | | | 438/255 |
| 2010/0151678 A1* | 6/2010 | Dydyk | H01L 21/30604 |
| | | | 438/665 |
| 2015/0228543 A1* | 8/2015 | Yu | H01L 29/4966 |
| | | | 257/739 |
| 2015/0245523 A1 | 8/2015 | Takagi et al. | |
| 2016/0207148 A1 | 7/2016 | Kobayashi et al. | |

* cited by examiner

METAL MEMBER, COMPOSITE OF METAL MEMBER AND RESIN MEMBER, AND PRODUCTION METHOD THEREFOR

CROSS REFERENCE TO RELATED APPLICATIONS

The present application is a continuation application of International Patent Application No. PCT/JP2017/039796 filed on Nov. 2, 2017, which designated the U.S. and claims the benefit of priority from Japanese Patent Application No. 2016-222542 filed on Nov. 15, 2016. The entire disclosures of all of the above applications are incorporated herein by reference.

TECHNICAL FIELD

The present disclosure relates to a metal member, a composite including the metal member and a resin member, a method for producing the metal member, and a method for producing the composite.

BACKGROUND

A metal member subjected to a surface treatment so as to be joined to a resin member for easy integration, and a composite obtained by joining the metal member and the resin member to each other for integration are used in many industrial fields.

SUMMARY

The present disclosure provides a metal member including a metal substrate and a porous metal layer, and a composite including the metal member and a resin member. The metal substrate has one surface, is made of a metal material, and has a region formed as an uneven layer having an uneven shape with respect to the one surface. The porous metal layer has a mesh-like shape and is formed on the uneven layer. The uneven layer includes a plurality of protrusions protruding in a direction normal to the one surface.

BRIEF DESCRIPTION OF THE DRAWINGS

The above and other objects, features and advantages of the present disclosure will become more apparent from the following detailed description made with reference to the accompanying drawings in which.

DETAILED DESCRIPTION

Figure 1:
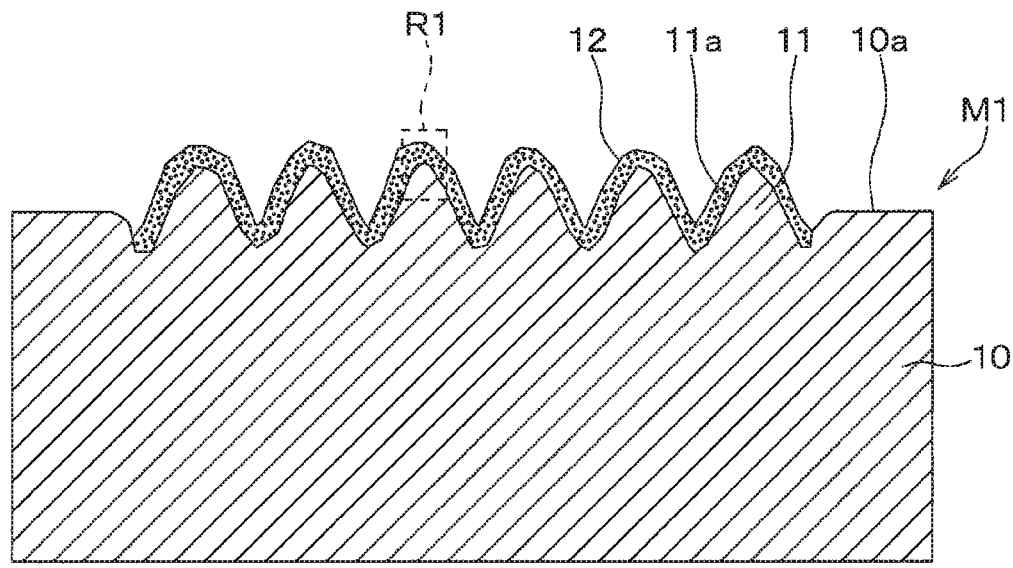
FIG. 1 is a cross-sectional view showing a metal member of a first embodiment.

When a metal member and a resin member are joined to each other, a minute gap may be formed on the boundary surface, which may cause insufficient adhesiveness and airtightness.

To address such a possibility, for example, in the metal member, a metal thin film roughened so as to have an uneven shape may be provided on the surface of a substrate made of a conductive metal material (hereinafter, referred to as a "roughened metal member"). Specifically, a roughened surface formed on a metal thin film is irradiated with a laser beam having a low energy density, for example, of 100 J/cm$^2$ or less, whereby a fine uneven structure is provided, in which the metal thin film is provided without being penetrated therethrough, and fine unevenness is formed. In the composite, a resin member may enter into the gap of the roughened surface of the metal thin film having the fine uneven structure so that the gap is filled with the resin member, whereby the roughened metal member and a resin member are joined to each other. For example, the composite is used for a joining structure or the like in a semiconductor device or the like.

Such a structure is likely to make the gap between the roughened metal member and the resin member smaller when the roughened metal member is joined to the resin member, and is suitable for being joined to the resin member. By joining the roughened metal member and the resin member to each other, the composite having improved adhesiveness and airtightness on the boundary surface is provided.

As described above, the roughened metal member is more suitable for being joined to the resin member than a conventional metal member is. However, the above-described fine uneven structure has a so-called needle-like shape, and is apt to be broken even with a minute force, whereby, when the needle portion is broken, the shape of the fine uneven structure may insufficiently exhibit an anchor effect. The fine uneven structure is made of the oxide of the metal thin film, whereby, when the fine uneven structure is exposed to a reducing atmosphere, the oxide is reduced to cause a dulled needle-like shape. This causes small roughness of the surface to cause small voids into which the resin member enters. In such a case, the roughened metal member has a shape unsuitable for being joined to the resin member.

The present disclosure provides a metal member having a shape different from a needle-like shape, having a structure having a surface including voids into which a resin member enters, and suitable for being joined to a resin member, a composite including the metal member and the resin member, and a method for producing the same.

Hereinafter, embodiments of the present disclosure will be described with reference to the drawings. In the following embodiments, the same or the equivalent parts will be described with the same reference signs.

First Embodiment

A first embodiment will be described with reference to FIGS. 1 to 4. A metal member M1 of the present embodiment shown in FIG. 1 is applied as a heat dissipation plate in a mold package obtained by sealing an electronic component with a molded resin or the like, a metal member used for an external drawing terminal, and a metal member requiring adhesiveness and airtightness such as a bonded portion of a die-cast product.

Figure 2:
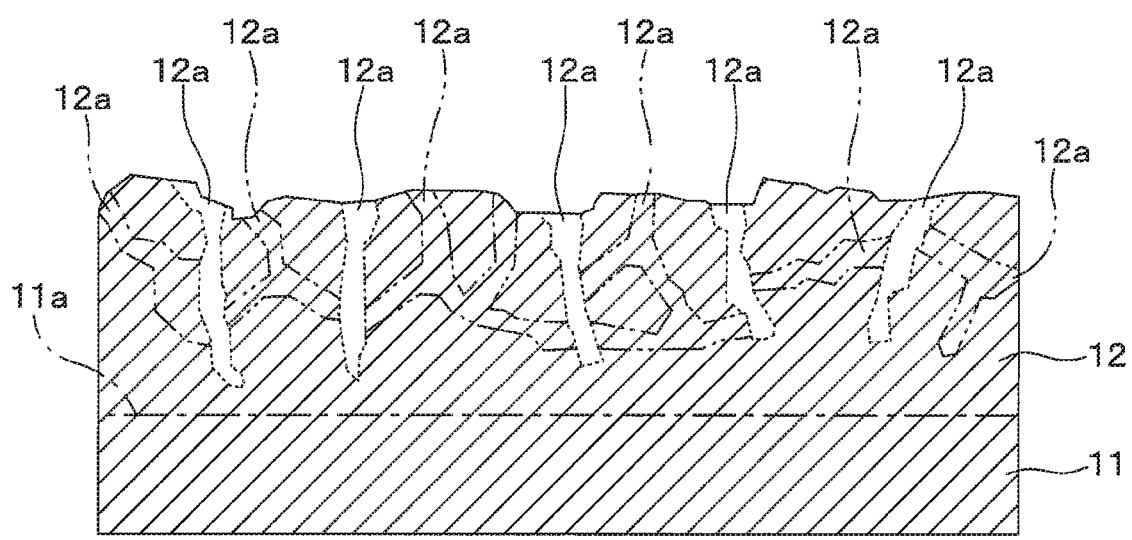
FIG. 2 is an enlarged sectional view of a partial region of an uneven layer and a porous metal layer in the metal member of the first embodiment.

FIG. 2 shows an enlarged cross section of a region R1 shown by a dashed line in FIG. 1, that is, a partial region where an uneven layer 11 and a porous metal layer 12 are provided. An uneven surface 11a as a boundary surface between the uneven layer 11 and the porous metal layer 12 is represented by a dashed-dotted line for descriptive purposes. In FIG. 2, holes 12a in the cross section shown in FIG. 2 are represented by dashed lines for descriptive purposes in order to make it easier to see the structure of the porous metal layer 12 having the holes 12a to be described later.

Furthermore, in FIG. 2, voids connecting the holes 12a in the cross section shown in FIG. 2 to each other in a horizontal direction in FIG. 2 in a cross section different from that in FIG. 2 are represented by dashed-two dotted lines. In FIGS. 4A to 4D, the results of observing the cross section in the region R1 represented by the dashed line in FIG. 1 by TEM are shown, and symbols are added for the sake of clarity. FIGS. 4A to 4D show the results of observing, by TEM, the cross section of a sample obtained by sealing a region where the uneven layer 11 and the porous metal layer 12 are formed in the metal member M1 of the present embodiment with a resin member, and thereafter cutting the region. Carbon atoms in FIG. 4D to be described later are attributable to the resin member used for the sealing.

As shown in FIGS. 1 and 2, the metal member M1 of the present embodiment includes a metal substrate 10 having one surface 10a and made of a metal material, an uneven layer 11 provided on the one surface 10a side of the metal substrate 10 and having an uneven shape, and a porous metal layer 12 provided on the uneven layer 11. As shown in FIG. 1 or FIG. 2, the porous metal layer 12 is provided on the uneven layer 11, and the plurality of holes 12a are formed in the porous metal layer 12.

When the metal member is joined to a different member, in the uneven layer 11, a micro-order uneven shape produces an anchor effect, and in the porous metal layer 12, the different member enters into the holes 12a to produce an anchor effect. Hereinafter, the anchor effect provided by the uneven layer 11 is referred to as a "first anchor effect", and the anchor effect provided by the porous metal layer 12 is referred to as a "second anchor effect". That is, the metal member M1 has a structure exhibiting the first anchor effect provided by the uneven layer 11 and the second anchor effect provided by the porous metal layer 12, that is, a double anchor effect. The metal member M1 has, for example, a rectangular parallelepiped shape, but the shape of the metal member M1 is not limited to the rectangular parallelepiped shape. The metal member M1 may have a cube shape, a cylindrical shape, a polygonal column shape, or a frame shape, or the like, and may have other various shapes.

As the metal material constituting the metal substrate 10, a low melting point metal material having a melting point of lower than 1000° C., or an alloy thereof, for example, Al, Ag, Mg, Zn, an Al alloy, or the like is preferably used. This is because the metal substrate 10 is required to be made of a low melting point metal material or a metal material made of an alloy thereof in order to form the uneven layer 11 and the porous metal layer 12.

The term "alloy" as used herein refers to a metal material containing a low melting point metal material as a main material and another metal material, and a high melting point metal having a melting point of 1000° C. or higher, for example, Cu, Mn, or Si may be contained as the other metal material. For example, when the low melting point metal material is Al, in addition to alloys of 1000-series of international aluminum alloys representing pure Al, alloys of from 2000-series representing an Al—Cu-based alloy to 7000-series representing an Al—Zn-based alloy may be used as the metal substrate 10. The phrase "containing a low melting point metal material as a main material" as used herein means that the low melting point metal material occupies 90% by mass or more of the entire alloy.

The metal substrate 10 may be made of a low melting point metal material, and may be a plate material, a component formed by scraping, a die-cast product, another component, or the like.

As shown in FIG. 1, the uneven layer 11 is provided on the one surface 10a of the metal member M1, has an uneven shape suitable for being joined to a different member, particularly a resin member, and is made of an oxide of a metal material constituting the metal substrate 10. The uneven layer 11 is formed so that a plurality of protrusions are arranged side by side with portions protruding in a direction normal to the one surface 10a in the uneven layer 11, that is, a one surface normal direction as the protrusions. The uneven layer 11 has the uneven shape as described above, whereby the adhesiveness and airtightness of the uneven layer 11 to the different member are improved by the first anchor effect when the metal member is joined to the different member.

It is preferable that, when the thickness of the plurality of protrusions constituting the uneven layer 11 in the one surface normal direction is defined as a height, the average height of the plurality of protrusions be 1 μm or more and less than 100 μm. It is considered that, when at least the average height of the protrusions is 1 μm, the double anchor effect is provided, but when the average height is less than 1 μm, the first anchor effect is low, which is less likely to provide the double anchor effect. Meanwhile, this is because, in the case of the metal member M1 in which the average height of the protrusions is more than 100 μm, the energy density of a laser beam in a producing step to be described later is inevitably increased, and when the energy density is excessively increased, the material of the metal substrate 10 scatters, which may cause a problem such as contamination.

In FIG. 1, the example in which the uneven shapes due to the uneven layer 11 are regularly arranged is mainly shown. However, the uneven shape may substantially exhibit the first anchor effect. The uneven layer 11 may have various shapes such as an irregularly arranged shape.

As shown in FIG. 1 or FIG. 2, the porous metal layer 12 is formed on the uneven layer 11 provided on the one surface 10a of the metal member M1, has a plurality of holes 12a suitable for being joined to the different member, particularly the resin member, and has a mesh-like shape.

Specifically, the holes 12a are gaps which a different flowable member can enter into and can be cured when being joined to the different member. That is, the porous metal layer 12 is formed so that the plurality of holes 12a are connected to each other in a mesh form, and extend to the outermost surface along the one surface normal direction in the porous metal layer 12 at a plurality of places, whereby the porous metal layer 12 has a mesh-like shape. That is, the holes 12a are connected to the outside air on the outermost surface of the porous metal layer 12 at a plurality of places.

Therefore, even when the other flowable member is applied on the holes 12a, the influence of air resistance when air is sealed is small unlike a hole-like void connected to the outside air only at one place, for example, a hole provided by an alumite treatment, and the different member is likely to flow into the holes 12a. Thus, the porous metal layer 12 having the plurality of holes 12a is formed in such a shape that the different member flows into the holes 12a and is cured, which exhibits the second anchor effect.

A direction normal to a tangent with respect to the uneven surface 11a as the boundary surface of the uneven layer 11 with the porous metal layer 12 is defined as an uneven normal direction, and the thickness of the porous metal layer 12 in the uneven normal direction is nano-order, that is, less than 1 μm. This is because, even if the thickness of the porous metal layer 12 in the uneven normal direction is 1 μm or more, an effect of improving adhesiveness or the like to the different member is obtained, but the significance of unnecessarily providing the porous metal layer 12 is low, and even if the thickness is less than 1 μm, the effect of improving adhesiveness or the like to the different member is obtained.

It is preferable that the maximum width dimension of the holes 12a be 100 nm or less, and the dimension width of the holes 12a be in the range of 1 nm or more and 100 nm or less. This is because, when the dimension width of the holes 12a is less than 1 nm, the resin member 20 is less likely to enter into the holes 12a, and when the dimension width of the holes 12a is more than 100 nm, the shape of the porous metal layer 12 comes close to a needle shape, which is less likely to maintain a fine shape during pressing or reducing.

The term "width dimension" as used herein means the dimension of the width in an uneven tangent direction of the holes 12a extending to the outermost surface of the porous metal layer 12, the uneven tangent direction being an optional direction on a plane parallel to the tangent with respect to the uneven surface 11a. The maximum width dimension means the maximum dimension width of the dimension widths.

The uneven layer 11 and the porous metal layer 12 are formed by irradiating a metal substrate 10 made of a low melting point metal material or an alloy thereof with a laser beam to be described later. The uneven layer 11 and the porous metal layer 12 only have to be provided on a joined surface to be joined to the different member, or may be formed on a part or whole region of the surface of the metal substrate 10.

Next, a method for producing the metal member M1 of the present embodiment will be described with reference to FIG. 3. The producing steps of the metal member M1 include the steps of: providing the metal substrate 10; irradiating the metal substrate 10 with a laser beam to melt and evaporate the surface of the metal substrate 10; and solidifying and reattaching the metal substrate after the irradiation of the laser beam.

In the step of irradiating the metal substrate with the laser beam to melt and evaporate the surface of the metal substrate 10 and the step of solidifying and reattaching the metal substrate after the irradiation of the laser beam, melting and evaporating, and solidifying and reattaching of a part of the metal substrate 10 occur instantaneously in order. However, herein, for descriptive purposes, the above two steps will be separately described.

First, as the step of providing the metal substrate 10, the metal substrate 10 having one surface 10a and made of a low melting point metal material or an alloy thereof is provided.

Next, as the step of melting and evaporating by the irradiation of the laser beam, the one surface 10a of the metal substrate 10 is irradiated with a pulse-oscillated laser beam while the position is changed at a predetermined interval. Thereby, as shown in FIG. 3, a laser irradiated region R2 irradiated with the laser beam on the one surface 10a of the metal substrate 10 is melted and evaporated.

Specifically, by irradiating the metal substrate 10 with the laser beam, a part of the laser irradiated region R2 of the one surface 10a is evaporated, and the remainder is melted. The pulse-oscillated laser beam is adjusted so that the energy density is less than 300 J/cm$^2$ and the pulse width is less than 1 μs. For example, an aluminum alloy is used as the metal substrate 10, and the aluminum alloy is irradiated with the laser beam in a state where the energy density, the pulse width, and the laser irradiated region R2 are respectively adjusted to 11 J/cm$^2$, 50 ns, and φ100 μm.

Herein, the energy density of the pulse-oscillated laser beam is preferably in the range of 10 J/cm$^2$ or more and less than 300 J/cm$^2$. This is because, when the energy density of the pulse-oscillated laser beam is as too low as about 2 J/cm$^2$, for example, the metal substrate 10 is not sufficiently melted and evaporated, so that the porous metal layer 12 is not formed. Meanwhile, this is because, when the energy density of the pulse-oscillated laser beam is as too high as 300 J/cm$^2$ or more, the metal substrate 10 is excessively melted or evaporated, and scatters to other region, so that splashing may disadvantageously cause contamination.

In the present embodiment, by moving a light source of the laser beam along an XY plane with the horizontal direction in FIG. 3 as an X direction and a direction orthogonal to the X direction on the plane of FIG. 3 as a Y direction, a part of the one surface 10a of the metal substrate 10 is irradiated with the laser beam in order. Upon the irradiation of the laser beam, the light source of the laser beam may be moved in a state where the metal substrate 10 is fixed, or the metal substrate 10 may be moved in a state where the light source of the laser beam is fixed.

Finally, as the step of solidifying and reattaching the metal substrate after the irradiation of the laser beam, the melted portion of the metal substrate 10 in the step of melting and evaporating the metal substrate is solidified, and the evaporated portion is reattached. Specifically, a part of the metal substrate 10 is melted or evaporated in the step pf melting and evaporating the metal substrate, and then solidified, whereby the uneven layer 11 is formed in the laser irradiated region R2 of the metal substrate 10.

Furthermore, a part of the evaporated metal substrate 10 is deposited inside and outside the laser irradiated region R2. At this time, a part of the evaporated metal substrate 10 is oxidized after the deposition to form an oxide, and fixed, thereby forming the porous metal layer 12. Therefore, it is preferable to perform at least the step of reattaching the metal substrate in an atmosphere containing oxygen, for example, in an atmospheric environment or the like.

Thus, it is possible to produce the metal member M1 in which the uneven layer 11 having an uneven shape and the porous metal layer 12 including the plurality of holes 12a are formed on a part of the one surface 10a of the metal substrate 10.

Figure 3A:
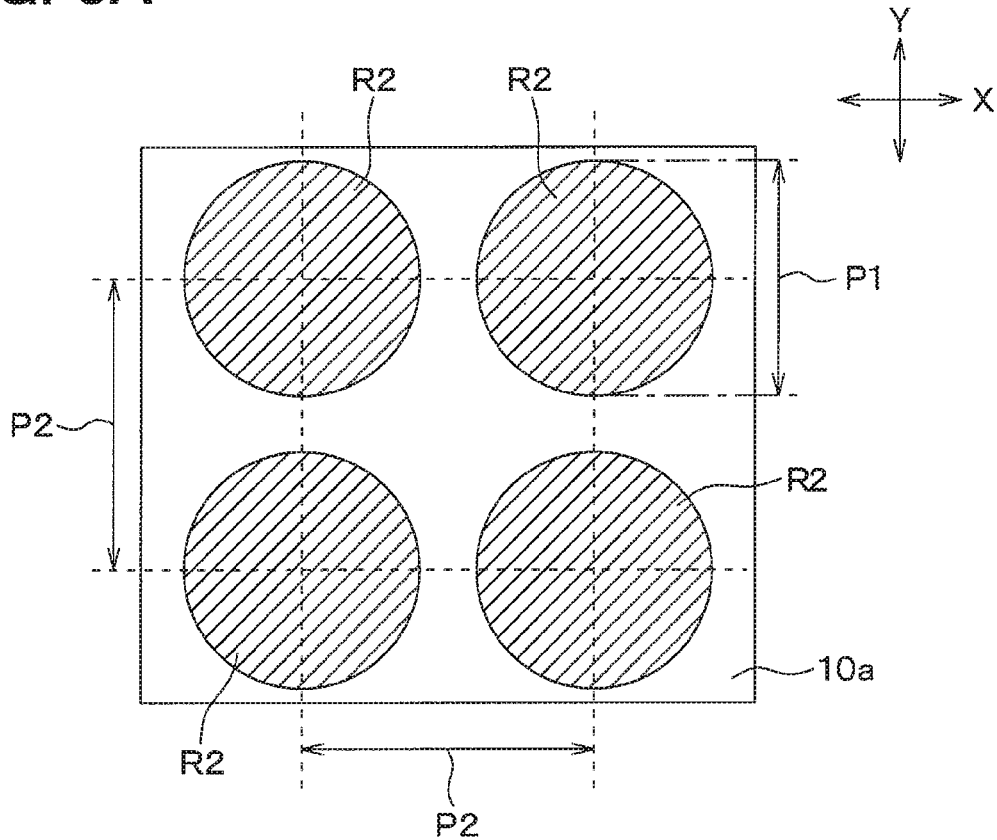
FIGS. 3A and 3B show the irradiation of a laser beam in a producing step of the metal member of the first embodiment.
Figure 3B:
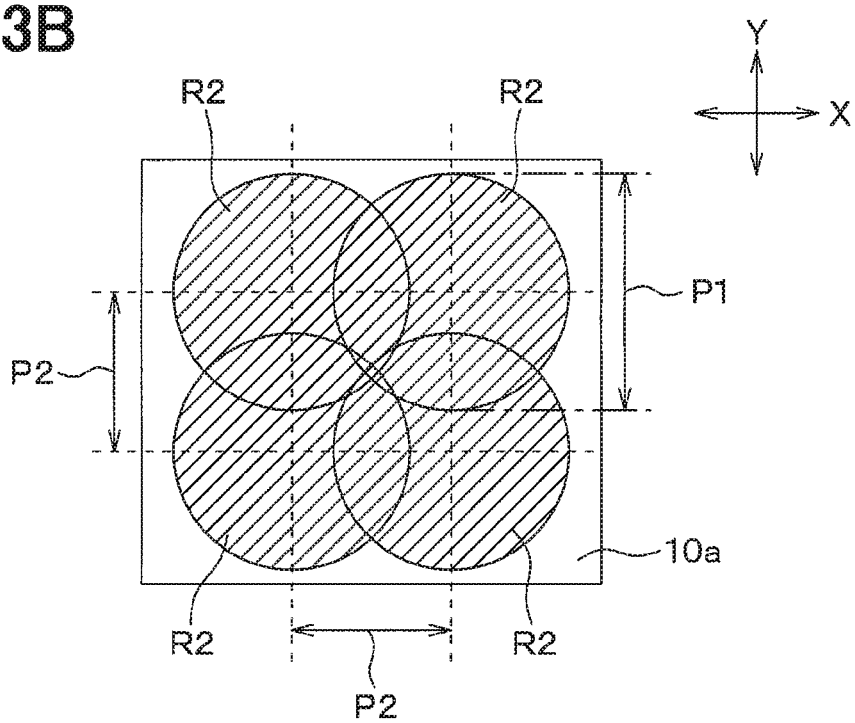

As shown in FIGS. 3A and 3B, with the diameter of the laser irradiated region R2 as an irradiation diameter P1, and a distance between the centers of the irradiation diameters P1 of the adjacent laser irradiated regions R2 as an irradiation pitch P2, the irradiation diameter P1 is preferably larger than the irradiation pitch P2.

When the irradiation diameter P1 is smaller than the irradiation pitch P2, the uneven layer 11 and the porous metal layer 12 are formed in the laser irradiated region R2, but as shown in FIG. 3A, an unprocessed region occurs to divide the adjacent laser irradiated regions R2 of the one surface 10a. That is, by forming the uneven layer 11 and the porous metal layer 12 on a part of the one surface 10a of the metal substrate 10, a shape suitable for improving adhesiveness and airtightness to the different member is provided. However, but in the unprocessed region, a shape providing a low effect of improving adhesiveness and airtightness to the different member remains.

Meanwhile, as shown in FIG. 3B, when the irradiation diameter P1 is larger than the irradiation pitch P2, the unprocessed region dividing the adjacent laser irradiated regions R2 of the one surface 10a does not occur. Even when the irradiation diameter P1 is slightly larger than the irradiation pitch P2, the unprocessed region merely occurs in a region around the center surrounded by the four adjacent laser irradiated regions R2. Therefore, the irradiation diameter P1 is set to be larger than the irradiation pitch P2, whereby the aggregate region of the laser irradiated regions R2 of the metal member M1 has a shape more suitable for improving adhesiveness and airtightness to the different member compared to the case where the irradiation diameter P1 is set to be smaller than the irradiation pitch P2.

Herein, a background leading to the uneven layer 11 and the porous metal layer 12 as the feature of the metal member M1 of the present embodiment will be described in detail.

A conventional metal member described in Patent Literature 1 has a surface including a fine uneven structure provided thereon, and has a structure having a shape close to a so-called needle-like shape. Therefore, in the metal member described in Patent Literature 1, a needle-like portion is broken by pressing, or a fine uneven structure portion is reduced in a reducing atmosphere, so that the shape of the fine uneven structure is dulled, which is less likely to maintain a shape suitable for adhesiveness and airtightness to the different member, particularly a resin member.

Other examples of the conventional technique include a technique of using an Al or Al alloy as a metal substrate and subjecting the metal substrate to an alumite treatment to form an oxide film having numerous holes referred to as pores. It is considered that the metal member including such an oxide film has a shape providing a high effect of improving the adhesiveness to the different member when the different member flows into the pores.

However, particularly in the case of the Al alloy, the oxide film is less likely to be formed by the alumite treatment depending on the material, which causes restricted material selection. The oxide film formed by the alumite treatment has a problem that cracks occur due to thermal stress or the like. When the cracks occur, the adhesiveness to the different member is lowered.

Furthermore, the pores have such a shape that only one place on the outermost surface side of the oxide film is connected to the outside air, whereby the influence of air resistance when the air is sealed is large, which makes it difficult to say that the pores have such a shape that the different member is likely to flow into the pores.

Therefore, the present inventors have conducted intensive studies on a metal member having a structure suitable for being joined to the different member, particularly, the resin member. As a result, the metal member M1 has been found, in which, in addition to the uneven layer 11 having a fine uneven structure having a shape different from a needle-like shape and having a micro-order uneven shape, the porous metal layer 12 having hole-like voids into which the resin member is likely to enter on the outermost surface side of the uneven layer 11 is provided on the surface of the metal member. The present inventors have found that the metal member M1 having the above-mentioned structure can be produced by using a low melting point metal material or an alloy thereof and irradiating the low melting point metal material or the alloy thereof with a laser beam having a low energy density with pulsed oscillation.

Thereby, the metal member M1 has a shape exhibiting a so-called double anchor effect which is a combination of the first anchor effect due to the uneven shape and the second anchor effect due to the resin member entering into the holes 12a when the metal member is joined to the resin member. The metal member M1 includes the uneven layer 11 having a micro-order uneven shape and the holes 12a on the outermost surface side of the uneven layer 11, whereby the metal member M1 has a structure in which a region having a sharp tip shape is small, and breaking due to pressing and the dulled shape of the fine structure due to reducing are suppressed.

The uneven layer 11 and the porous metal layer 12 are formed of the oxide of the metal substrate 10 by solidifying the metal substrate 10 melted or evaporated by the laser beam, whereby the uneven layer 11 and the porous metal layer 12 have corrosion resistance. When the uneven layer 11 and the porous metal layer 12 are reduced in the reducing atmosphere, the effect of corrosion resistance becomes low, but the uneven layer 11 and the porous metal layer 12 do not have a needle-like shape, whereby, even if the shape is somewhat dulled, the double anchor effect is less likely to be impaired.

Furthermore, the uneven layer 11 and the porous metal layer 12 are formed by the above steps, whereby the uneven layer 11 and the porous metal layer 12 have small residual stress and high crack resistance, and provide a formation region having a high degree of freedom. In addition, the uneven layer 11 and the porous metal layer 12 can be formed by using the low melting point metal material or the alloy thereof, whereby the metal member M1 provides material selection having a high degree of freedom.

According to the test production examination by the present inventors, the low melting point metal material or the alloy thereof is used as the metal substrate 10, and the metal substrate 10 is irradiated with a laser beam having a pulse width of less than 1 μs and an energy density of 10 J/cm$^2$ or more and less than 300 J/cm$^2$, to obtain the metal member M1 of the present embodiment. Under a condition different from the condition, the metal member M1 including the uneven layer 11 and the porous metal layer 12 is less likely to be produced. A detailed mechanism in which the uneven layer 11 and the porous metal layer 12 are formed on the metal substrate 10 by the above production method is unknown at this time.

However, as the reason why the uneven layer 11 and the porous metal layer 12 are formed under the above condition, the following estimation mechanism will be considered.

By the irradiation of the laser beam, a portion of the metal substrate 10 to which energy required for evaporation, that is, energy equal to or higher than evaporation energy is applied is evaporated, and fixed while releasing energy applied when being then reattached. It is considered that at this time, the evaporated metal substrate 10 starts to be fixed when the energy of the metal substrate 10 is less than the evaporation energy. That is, it is presumed that, before the energy obtained by subtracting the evaporation energy from the energy applied by the irradiation of the laser beam, that is, excessive energy is released, movement such as vibration, of the reattached metal substrate 10 is provided by the excessive energy.

It is considered that, when the excessive energy released before the metal substrate 10 is reattached and fixed is large, the amount of the movement such as vibration increases, whereby a complicated structure such as a mesh form can be provided. Therefore, it is presumed that the large excessive energy released before the metal substrate 10 is completely fixed causes the formation of the uneven layer 11 and the porous metal layer 12, particularly the porous metal layer 12 from the metal substrate 10.

Herein, when a high melting point metal, for example, a metal material having a melting point of 1000° C. or higher is irradiated with a laser beam, a part of the high melting point metal is evaporated by energy equal to or higher than evaporation energy being applied. At this time, it is considered that the melting point of the high melting point metal is as high as 1000° C. or higher, whereby the evaporation energy of the high melting point metal is large, and the excessive energy is small.

Therefore, it is considered that the energy lost before being fixed after being reattached is small, and the high melting point metal has low energy released by the movement such as vibration before being reattached and fixed. Therefore, it is considered that the uneven layer 11 and the porous metal layer 12, particularly the porous metal layer 12 are less likely to be formed by irradiating the high melting point metal with the laser beam.

Meanwhile, it is considered that, when a low melting point metal is irradiated with a laser beam, the low melting point metal is evaporated as with the high melting point metal, but the melting point of the low melting point metal is as low as lower than 1000° C., whereby the evaporation energy of the low melting point metal is small, and the excessive energy is large. Therefore, it is considered that the energy lost before being fixed after being reattached is large, and the energy of the low melting point metal released by the movement such as vibration before being reattached and fixed is larger than that of the high melting point metal. Therefore, it is considered that the uneven layer 11 and the porous metal layer 12, particularly the porous metal layer 12 are formed by irradiating the low melting point metal with the laser beam.

From the estimation mechanism as described above, it is considered that a low melting point metal material (for example, Al or an Al alloy) is required to be irradiated with a laser beam having a low energy density (for example, less than 300 J/cm$^2$) with pulse oscillation in order to produce the metal member M1 of the present embodiment.

Figure 4A:
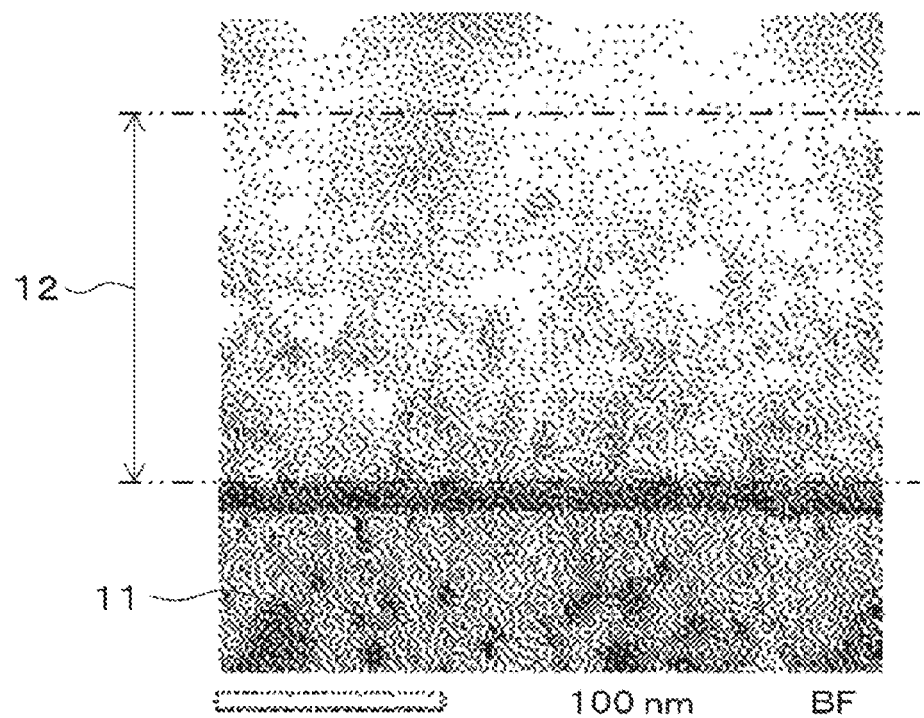
FIG. 4A shows the results of observing the cross sections of the uneven layer and the porous metal layer in the metal member of the first embodiment by a transmission electron microscope (TEM)
Figure 4B:
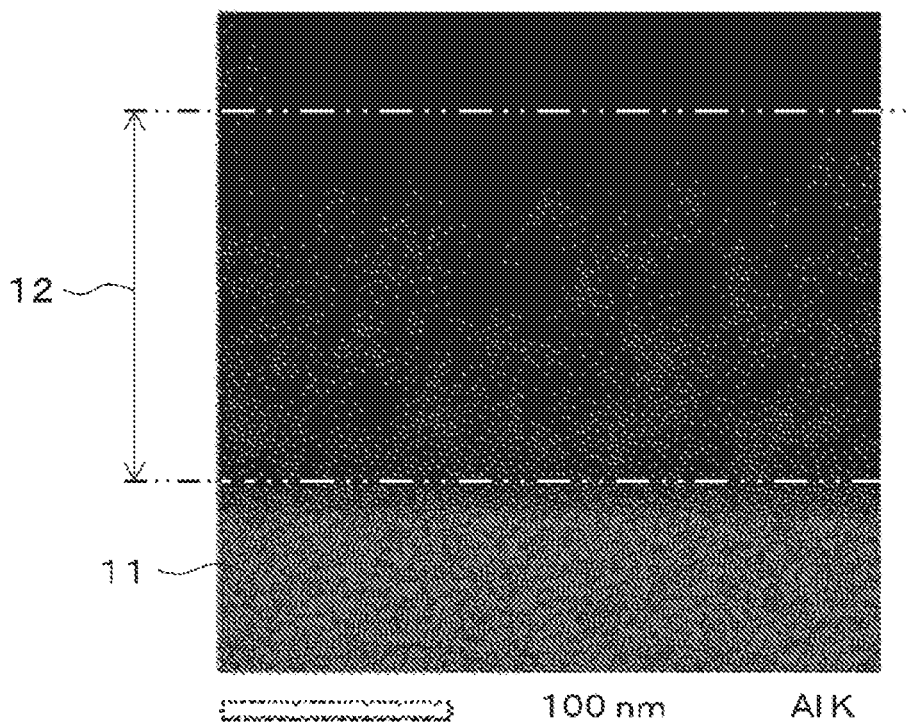
FIG. 4B shows the results of observing the cross sections of the uneven layer and the porous metal layer in the metal member of the first embodiment by TEM.
Figure 4C:
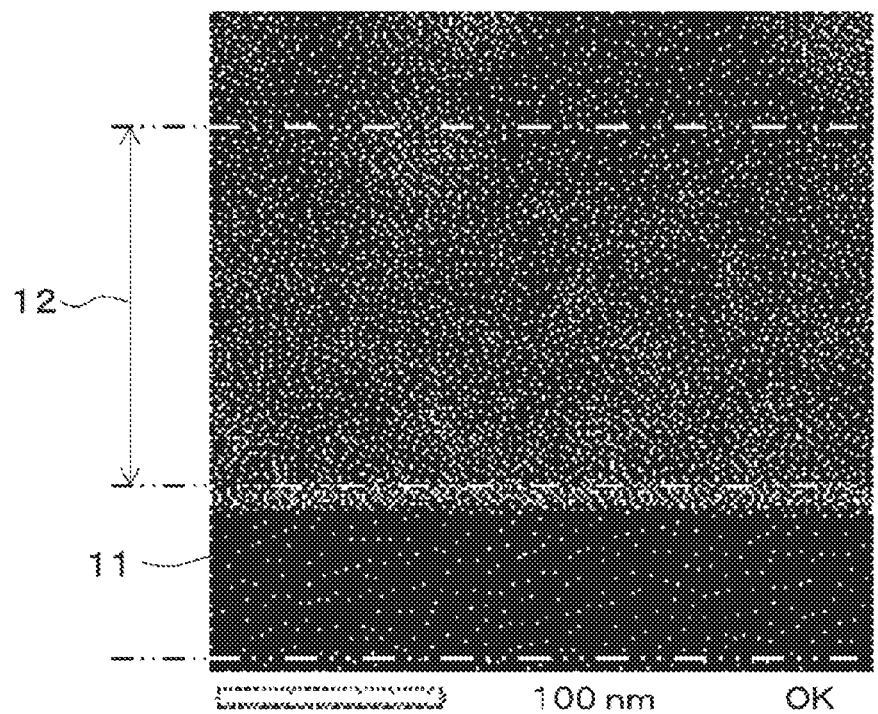
FIG. 4C shows the results of observing the cross sections of the uneven layer and the porous metal layer in the metal member of the first embodiment by TEM.
Figure 4D:
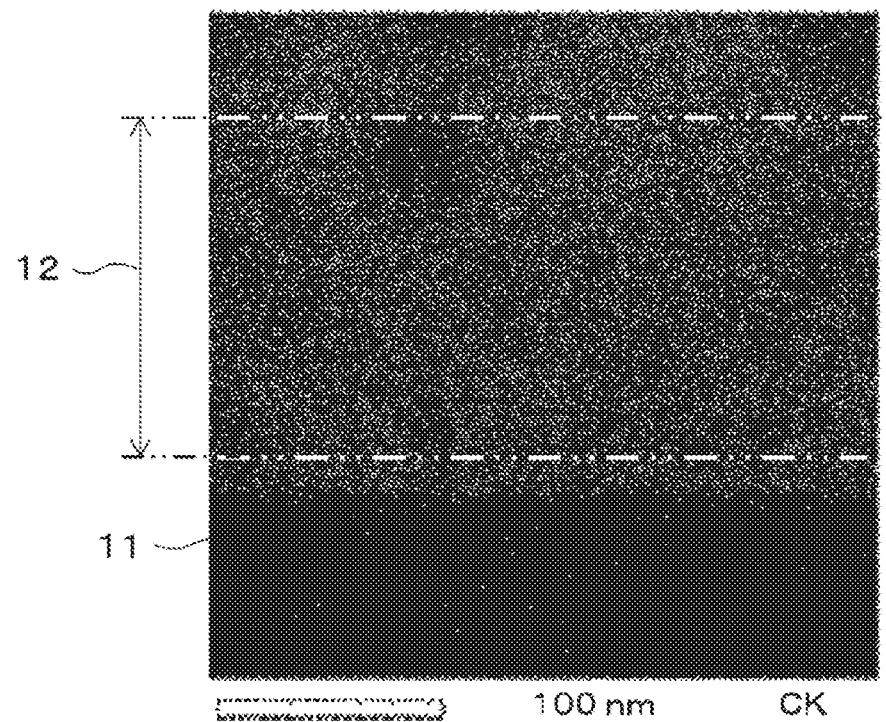
FIG. 4D shows the results of observing the cross sections of the uneven layer and the porous metal layer in the metal member of the first embodiment by TEM.

Next, the results of observing the cross section of the metal member M1 using Al as the low melting point metal material by TEM will be described with reference to FIGS. 4A to 4D. FIG. 4A shows the cross section of the metal member M1 in which the uneven layer 11 and the porous metal layer 12 are formed, and FIG. 4B shows the distribution of Al atoms in the same cross section as that of FIG. 4A. FIG. 4C shows the distribution of oxygen atoms in the same cross section as that of FIG. 4A, and FIG. 4D shows the distribution of carbon atoms in the same cross section as that of FIG. 4A. A rectangular frame line shown in the lower left of each of FIGS. 4A to 4D is a scale, which represents that the length of the frame line corresponds to 100 nm.

FIG. 4A shows an electron image in the cross section of a partial region of the uneven layer 11 and the porous metal layer 12 formed by the irradiation of the laser beam. FIG. 4A shows that a region appearing black is a portion where a substance having a large atomic weight such as a metal is present, and a region appearing white is a portion where a substance having a small atomic weight such as a resin is present, or a cavity or the like is present. It is considered that FIG. 4A shows that Al in the uneven layer 11 has a densely filled structure because the electronic image of a TEM photograph is black and clear.

Meanwhile, Al in the porous metal layer 12 has many portions appearing white in the electronic image of the TEM photograph, and a portion which is black and clear is not continuous. In FIG. 4B, Al atoms in the porous metal layer 12 are dispersed without particularly having regularity. From these results, it is considered that Al of the porous metal layer 12 does not have a filled structure, which represents a rough structure having voids.

FIG. 4C shows that oxygen atoms are present in a region appearing white. According to this, the oxygen atoms in the region of the porous metal layer 12 are dispersed without particularly having regularity. Also from this, it is considered that Al in the porous metal layer 12 has not a densely filled structure or a needle-like structure but a rough structure having voids.

FIG. 4D shows that carbon atoms are present in a region appearing white. According to this, it is shown that the carbon atoms are present in the region of the porous metal layer 12, and it is considered that the carbon atoms derived from the resin member enter into the porous metal layer 12. It is considered that, when the resin member enters into the porous metal layer 12 having a rough structure which is not a needle-like structure, the structure of the porous metal layer 12 has many voids, and the voids are connected in a mesh form.

The thickness of the porous metal layer 12 shown in FIG. 4 in the uneven normal direction is about 200 nm as determined from the scale shown in FIG. 4.

Thus, the metal member M1 is provided, which uses the low melting point metal material or the alloy thereof as the metal substrate 10, and includes the uneven layer 11 having a micro-order uneven shape on a part or whole of one surface 10a of the metal substrate 10 and the nano-order porous metal layer 12 on the uneven layer 11. The porous metal layer 12 has a fine structure having holes 12a which are hole-like voids.

Thereby, the metal member M1 is provided, which has a structure exhibiting a so-called double anchor effect exhibiting the second anchor effect due to the different member entering into the holes 12a in addition to the first anchor effect due to the micro-order uneven shape when the metal member is joined to the different member. The porous metal layer 12 has a structure having a plurality of holes 12a unlike a needle-like shape having a thin sharp tip, whereby the porous metal layer 12 is less likely to be broken by pressing. Furthermore, even if the porous metal layer 12 is reduced in a reducing atmosphere to have a somewhat dulled shape, the holes 12a are not blocked, whereby a shape suitable for being joined to the different member is maintained as it is.

Therefore, the metal member M1 is less likely to be adversely influenced by pressing or reducing even after being produced, and a shape suitable for being joined to the different member is maintained. The metal member M1 may use the low melting point metal material or the alloy thereof as the substrate, and provides material selection having a high degree of freedom. The region of the metal member M1 in which the uneven layer 11 and the porous metal layer 12 are formed is made of the oxide of the metal material, whereby the region has corrosion resistance as long as the region is not reduced.

By using the low melting point metal material or the alloy thereof as the metal substrate 10, and irradiating the one surface 10a of the metal substrate 10 with the laser beam having a low energy density with pulsed oscillation, the metal member M1 can be produced, which includes the uneven layer 11 having a shape suitable for being joined to the different member and the porous metal layer 12. The uneven layer 11 and the porous metal layer 12 can be formed in the region irradiated with the laser beam, whereby the degree of freedom of the formation region having a shape suitable for being joined to the different member can be increased according to the production method.

Second Embodiment

A second embodiment will be described with reference to FIGS. 5 and 6. In FIG. 6, holes 12a in a cut surface are represented by dashed lines as with FIG. 2, and the holes 12a connecting the holes 12a in the cut surface in FIG. 6 in a horizontal direction in FIG. 6 to each other on a surface different from the cut surface in FIG. 6 are represented by dashed-two dotted lines. An uneven surface 11a is represented by a dashed-dotted line.

Figure 5:
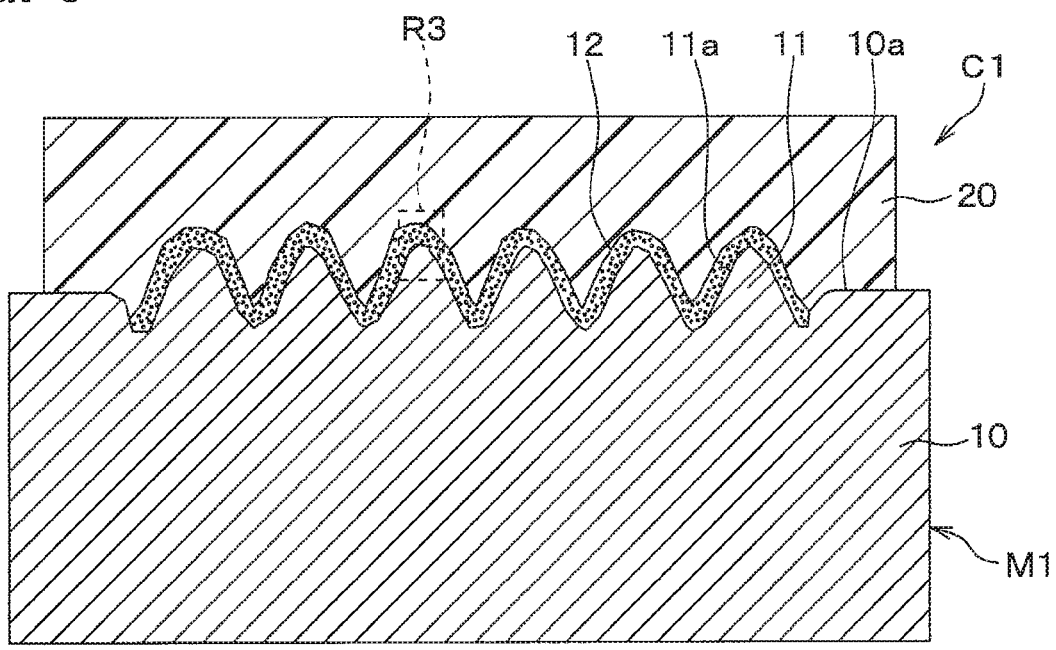
FIG. 5 is a cross-sectional view showing a composite of a second embodiment.
Figure 6:
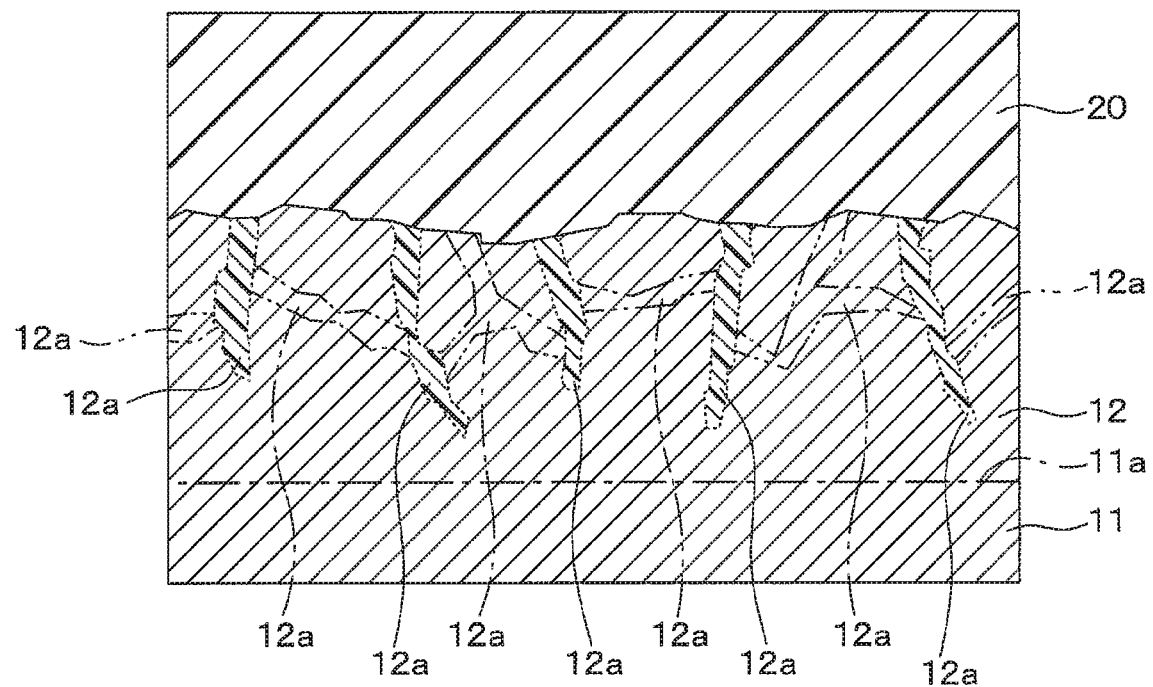
FIG. 6 is a cross-sectional view showing a state where a metal member and a resin member are joined to each other in the composite of the second embodiment.

A composite C1 of the present embodiment shown in FIG. 5 is applied as a composite requiring adhesiveness and airtightness such as a molded package obtained by sealing an electronic component with a molded resin, or a die-casted product joined to another metal member via a resin material. As shown in FIG. 5, the second embodiment is different from the first embodiment in that the composite C1 is obtained by joining a metal member M1 of the first embodiment and a resin member 20 to each other via an uneven layer 11 and a porous metal layer 12 provided on the metal member M1. In the present embodiment, this difference will be mainly described.

The resin member 20 is joined via the uneven layer 11 and the porous metal layer 12 provided on the metal member M1, and is made of a known thermosetting resin or thermoplastic resin such as an epoxy resin, a polyamide resin, or a polyphenylene sulfide resin.

The resin member 20 only has to be a flowable resin material so as to flow into the holes 12a as described later, and is not limited to the above-mentioned materials. Other thermoplastic resin, thermosetting resin, and ultraviolet curable resin, or the like may be used. The resin member 20 may contain a filler for the purpose of reducing a difference in thermal expansion coefficient between the resin member 20 and the metal member M1, or the like.

The resin member 20 is provided so as to cover one surface 10a of the metal member M1 including the uneven layer 11 and the porous metal layer 12, and enters into the holes 12a provided in the porous metal layer 12 while the uneven layer 11 is filled with the resin member 20 along the shape of the uneven layer 11.

Specifically, as shown in FIG. 5, as a result of sealing the metal member M1 with a flowable resin material and curing the resin material when the composite C1 of the present embodiment is produced, the resin member 20 enters into the holes 12a, and block the holes 12a. Thereby, the resin member 20 is joined to the metal member M1 by a first anchor effect provided by the filling of unevenness due to the uneven layer 11 and the porous metal layer 12 and a second anchor effect provided by blocking the holes 12a in a state of flowing into the holes 12a, that is, a double anchor effect.

Next, a method for producing the composite C1 of the present embodiment will be briefly described. First, the metal member M1 including the uneven layer 11 and the porous metal layer 12 is provided by the same steps as that described in the method for producing the metal member M1 of the first embodiment.

Next, the flowable resin material, for example, a liquid epoxy resin is applied onto the one surface 10a of the metal member M1 on which the uneven layer 11 and the porous metal layer 12 are provided. At this time, the size of a premonomer of the epoxy resin before being cured by crosslinking is about several nm, whereby the epoxy resin flows into the holes 12a formed with a diameter of 1 nm or more and less than 100 nm. Thereafter, the epoxy resin is cured by a heat treatment to form the resin member 20, whereby the composite C1 of the present embodiment can be produced, in which the resin member 20 enters into the holes 12a of the porous metal layer 12.

The size of one molecule of the polymer of the resin material is on the order of Angstrom (Å) unit in a liquid state before being cured. A prepolymer having a C—C bond length of about 0.154 Å and a C—C bond angle of about 109.5° is generally a freely linked polymer having a degree of polymerization of 340 to 3000, and its average inter-terminal distance is about 3 to 10 nm. In view of this, in order to allow the resin material to flow into the holes 12a, the maximum width dimension of the holes 12a of the metal member M1 is preferably 1 nm or more, and more preferably 3 nm or more.

Next, adhesion between the metal member and the resin member in the composite of the present embodiment will be described.

Nano-order needle-like unevenness, that is, conventional fine unevenness is formed in the metal member by the irradiation of a laser beam. However, when the fine unevenness is reduced in a reducing atmosphere after the fine unevenness is formed, the fine shape is dulled, or the fine unevenness is apt to be broken by pressing. Therefore, as a result, voids when the metal member is joined to the resin member are decreased.

Even if the composite obtained by joining the metal member having conventional fine unevenness not influenced by pressing or reducing and the resin member to each other is subjected to a peeling test, breakage occurs in the bulk of the resin member. This shows that, by providing the conventional fine unevenness on the metal member, an adhesion force between the metal member and the resin member is stronger, and breakage occurs in the bulk of the resin having lower strength than the adhesion force.

Meanwhile, when the composite in which the metal member having the needle-like unevenness influenced by reducing or pressing and the resin member are joined to each other is subjected to a peeling test, peeling occurs in the boundary surface between the metal member and the resin member. This shows that the adhesion force between the metal member and the resin member is decreased under the influence of pressing and reducing.

Meanwhile, even when the metal member M1 influenced by pressing or reducing is used, in the composite including the metal member M1 and the resin member 20 of the present embodiment, the bulk of the resin is often broken in the peeling test. This is considered to be because the uneven layer 11 of the metal member M1 is micro-order, whereby the uneven layer 11 is less likely to be broken, and the porous metal layer 12 is a mesh-like layer, whereby the porous metal layer 12 is less likely to be influenced by breaking due to pressing and shape dulling due to reducing.

That is, it is presumed that, in the composite of the present embodiment, even if the metal member M1 is influenced by pressing or reducing, the voids into which the resin member enters during joining are likely to remain, whereby the maintained adhesiveness is higher than that of the composite using the metal member having the conventional fine unevenness.

Thus, the composite C1 is provided, which is obtained by joining the metal member M1 including the uneven layer 11 and the porous metal layer 12 and the resin member 20 to each other, and is formed so that the resin member 20 covers the uneven layer 11 and the holes 12a provided in the porous metal layer 12 are filled with the resin member 20. Thereby, by the double anchor effect of the first anchor effect provided by the uneven layer 11 and the second anchor effect provided by the porous metal layer 12, the metal member M1 and the resin member 20 are firmly adhered to each other, whereby the composite C1 is provided, which has higher adhesiveness and airtightness than those of the composite including the conventional metal member and the resin member.

Third Embodiment

A third embodiment will be described with reference to FIG. 7. As with the second embodiment, a composite C2 of the present embodiment shown in FIG. 7 includes members corresponding to a metal member M1 and a resin member 20, but the third embodiment is different from the second embodiment in that the composite C2 is applied to a mold package obtained by sealing an electronic component with a molded resin. In the present embodiment, this difference will be mainly described.

The composite C2 includes a heat dissipation material 32, a substrate 30 having a front surface 30a and a back surface 30b, an electronic component 31, and a molded resin 33 sealing a part of the heat dissipation material 32, the substrate 30, and the electronic component 31. The heat dissipation material 32, the substrate 30, and the electronic component 31 are stacked in this order. In such a configuration, an engaging layer 32a corresponding to the uneven layer 11 and the porous metal layer 12 in the second embodiment is formed in a partial region of the boundary surface of the front surface of the heat dissipation material 32 with the molded resin 33. The heat dissipation material 32 of the composite C2 corresponds to the metal member M1 in the second embodiment, and the molded resin 33 of the composite C2 corresponds to the resin member 20 in the second embodiment.

For example, the substrate 30 has the front surface 30a and the back surface 30b, and has a rectangular plate shape. The substrate 30 is made of an insulating material such as glass or ceramic. The electronic component 31 is, for example, a semiconductor IC chip, a circuit element, or the like, and is mounted on the front surface 30a side of the substrate 30 via an adhesive, a solder, or the like (not shown in FIG. 7). The molded resin 33 is made of a known resin material such as an epoxy resin or a polyamide resin, for example.

Figure 7:
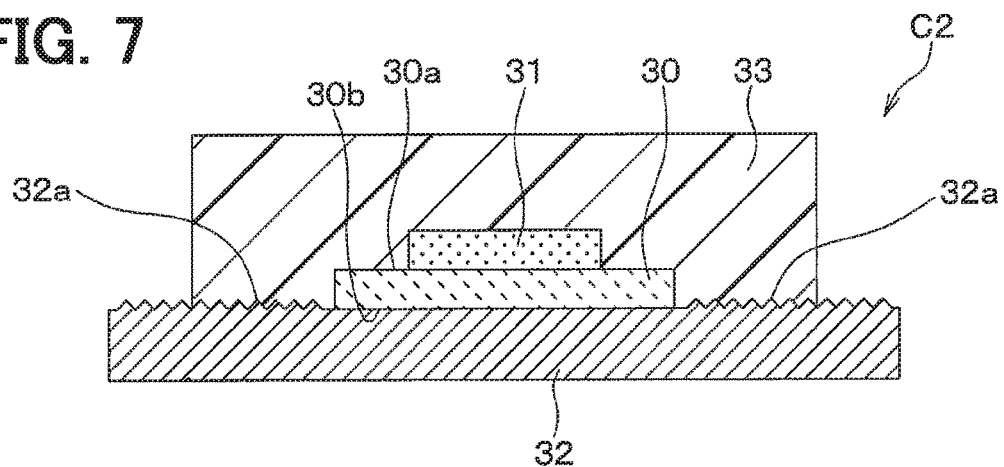
FIG. 7 is a cross-sectional view showing a composite of a third embodiment.

The heat dissipation material 32 is made of, for example, Al, an Al alloy, or the like, and is thermally connected to the back surface 30b of the substrate 30 via an adhesive, a solder, or the like (not shown in FIG. 7). For example, the heat dissipation material 32 has a larger area than that of the substrate 30, and has a rectangular plate shape. The surface of the heat dissipation material 32 opposite to the surface connected to the substrate 30 is exposed from the molded resin 33. An uneven layer 11 and a porous metal layer 12 for being joined to the molded resin 33 are provided in a region of the heat dissipation material 32 which is different from the region connected to the substrate 30. The heat dissipation material 32 and the molded resin 33 are firmly adhered to each other via the uneven layer 11 and the porous metal layer 12.

The composite C2 includes the heat dissipation material 32 including the uneven layer 11 and the porous metal layer 12, and has the same structure as that of a known mold package except that the heat dissipation material 32 and the molded resin 33 are joined via the uneven layer 11 and the porous metal layer 12.

The composite C2 is produced by a known producing step of a mold package having the same structure except that the heat dissipation material 32 including the uneven layer 11 and the porous metal layer 12 is provided. In providing the heat dissipation material 32 including the uneven layer 11 and the porous metal layer 12, the heat dissipation material 32 can be provided by the same step as that described in the second embodiment, and thus the description thereof will be omitted.

By forming the mold package having the above-described configuration from the composite C2, the heat dissipation material 32 and the molded resin 33 are firmly adhered to each other via the uneven layer 11 and the porous metal layer 12, and the mold package has high adhesiveness and airtightness.

Fourth Embodiment

Figure 8:
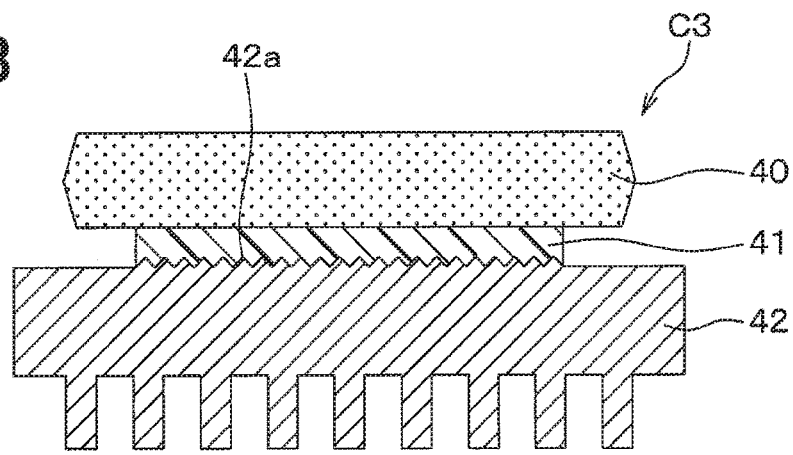
FIG. 8 is a cross-sectional view showing a composite of a fourth embodiment.

A fourth embodiment will be described with reference to FIG. 8. A composite C3 shown in FIG. 8 includes members corresponding to a metal member M1 and a resin member 20 as with the second embodiment, but the fourth embodiment is different from the second embodiment in that the composite C3 is applied to a semiconductor device in which a power module 40 and a heat dissipation fin 42 are joined to each other. In the present embodiment, this difference will be mainly described.

The composite C3 is the semiconductor device in which the power module 40 and the heat dissipation fin 42 are joined to each other via a joining material 41. The power module 40 is a mold package incorporating a power semiconductor such as IGBT (abbreviation of Insulated Gate Bipolar Transistor) or MOSFET (abbreviation of metal-oxide-semiconductor field-effect transistor), and has a structure similar to a known structure.

In such a configuration, an engaging layer 42a corresponding to the uneven layer 11 and the porous metal layer 12 in the second embodiment is formed in a partial or whole region of the boundary surface of the front surface of the heat dissipation fin 42 with the joining material 41. The heat dissipation fin 42 of the composite C3 corresponds to the metal member M1 in the second embodiment, and the joining material 41 of the composite C3 corresponds to the resin member 20 in the second embodiment.

The joining material 41 is provided for joining the heat dissipation fin 42 and the power module 40 to each other, and is made of, for example, a Si-based material having high thermal conductivity and high adhesiveness to a metal material, or the like. The engaging layer 42a provided on the heat dissipation fin 42 is filled with the joining material 41, whereby a double anchor effect occurs, which causes the joining material 41 to be firmly adhered to the heat dissipation fin 42.

The heat dissipation fin 42 is a member for dissipating heat generated when the semiconductor device is driven. The heat dissipation fin 42 has a known heat dissipation fin shape, and includes a plurality of plate-like members arranged at regular intervals along a direction parallel to each other on a surface opposite to a joining surface with the semiconductor device, for example.

The composite C3 can be produced by a known method for joining a power module and a heat dissipation fin to each other except that the heat dissipation fin 42 including the engaging layer 42a corresponding to the uneven layer 11 and the porous metal layer 12 is provided. In providing the heat dissipation fin 42 including the uneven layer 11 and the porous metal layer 12, the heat dissipation fin 42 can be provided by the same step as that described in the second embodiment, and thus the description thereof will be omitted.

By forming the semiconductor device having the above-described configuration from the composite C3, the heat dissipation fin 42 and the power module 40 are firmly adhered to each other via the engaging layer 42a, and the semiconductor device has high adhesiveness and airtightness, and excellent heat dissipation characteristics.

Modification of Fourth Embodiment

Next, a modification of a fourth embodiment will be described with reference to FIG. 9. In the composite C3 of the fourth embodiment, the semiconductor device having a structure dissipating heat from one surface of the power module 40 is shown, but as shown in FIG. 9, the semiconductor device may have a structure dissipating heat from both the surfaces of a power module 52.

Figure 9:
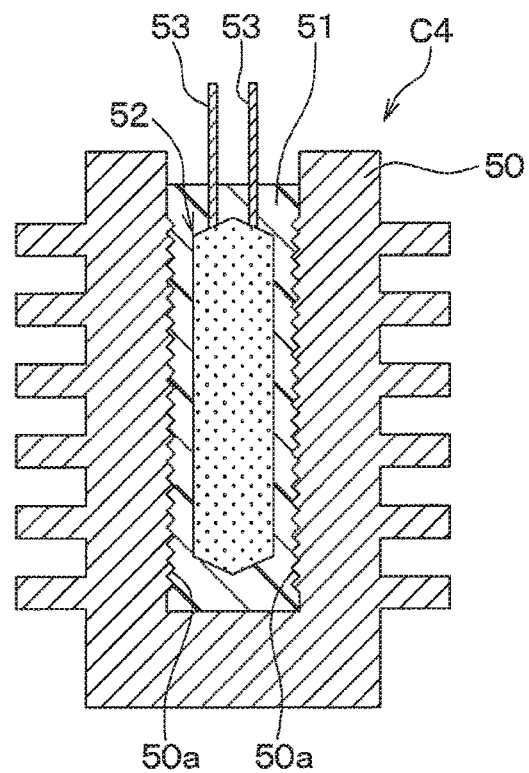
FIG. 9 is a cross-sectional view showing a composite as a modification of the fourth embodiment.

Specifically, as shown in FIG. 9, a composite C4 of the modification includes a power module 52 having a terminal 53, a metal case 50 which is a housing member for the power module 52 and a heat dissipation member, and a sealing resin 51 sealing the power module 52. In such a configuration, a portion of the power module 52 excluding a part of the terminal 53 is housed so as to be entirely surrounded by a housing portion of the metal case 50 housing the power module 52, and sealed with the sealing resin 51. The terminal 53 of the power module 52 is exposed from the sealing resin 51. An engaging layer 50a corresponding to an uneven layer 11 and a porous metal layer 12 is formed on the inner wall of the housing portion of the metal case 50.

Thereby, the composite C4 serves as the semiconductor device in which the metal case 50 and the sealing resin 51 are firmly adhered to each other, and which has a double-sided heat dissipation structure for releasing heat generated when the power module 52 is driven from both the surfaces of the power module 52.

Other Embodiments

While the present disclosure has been described with reference to embodiments thereof, it is understood that the present disclosure is not limited to the embodiments and structures. The present disclosure is intended to cover various modification examples and modifications within the range of equivalency. In addition, various combinations and configurations, and further, other combinations and configurations including more, less, or only a single element thereof are also within the spirit and scope of the present disclosure.

For example, the composite C1 shown in the second embodiment is obtained by joining the metal member and the resin member to each other, and only has to be applied to a member requiring adhesiveness and airtightness between the metal member and the resin member. The composite C1 can be applied to embodiments excluding the examples described in the third embodiment and the fourth embodiment. Specifically, aluminum die-casting or magnesium die-casting or the like used as the metal member M1, and a resin material, rubber, or the like used as the resin member 20 may be joined to each other, to apply the joined product to a portion particularly requiring airtightness in automobile components or the like.

In the third embodiment, the example has been described, in which the uneven layer 11 and the porous metal layer 12 are provided only on the surface side of the heat dissipation material 32 joined to the back surface 31b of the substrate 30, but the uneven layer 11 and the porous metal layer 12 may be provided on the other surface sealed with the molded resin 33. In the third embodiment, the example of the single-sided heat dissipation structure including only one heat dissipation material 32 has been described. However, a double-sided heat dissipation structure may be used, in which the electronic component 31 is sandwiched between the two heat dissipation materials 32.

Optional aspects of the present disclosure will be set forth in the following clauses.

According to a first aspect of the present disclosure, a metal member includes a metal substrate and a porous metal layer. The metal substrate has one surface, is made of a metal material, and has a region formed as an uneven layer having an uneven shape with respect to the one surface. The porous metal layer has a mesh-like shape and is formed on the uneven layer.

The uneven layer includes a plurality of protrusions protruding in a direction normal to the one surface. The protrusions included in the uneven layer have an average height of less than 100 µm. When a direction normal to a tangent with respect to an uneven surface as a boundary surface of the uneven layer with the porous metal layer is defined as an uneven normal direction, a thickness of the porous metal layer in the uneven normal direction is less than 1 µm.

Thereby, the uneven layer having an uneven shape and the porous metal layer having a mesh-like shape and having holes on the uneven layer are provided, whereby a different member exhibits an anchor effect in each of the uneven layer and the porous metal layer, to provide the metal member suitable for being joined to the different member.

According to a second aspect of the present disclosure, a method, which is for producing a metal member, includes providing a metal substrate having one surface and made of a metal material, irradiating the one surface of the metal substrate with a pulse-oscillated laser beam having an energy density of less than 300 J/cm$^2$ with a pulse width of less than 1 µs to melt or evaporate a part or whole of the one surface, solidifying the melted or evaporated region of the one surface to form an uneven layer having an uneven shape from the one surface, and reattaching the evaporated metal substrate to the inside and outside of the melted or evaporated region of the one surface to form a porous metal layer having a mesh-like shape on the uneven layer.

Thereby, the uneven layer having an uneven shape and the porous metal layer having a mesh-like shape and having holes on the uneven layer are formed on the metal substrate, whereby the different member can exhibit an anchor effect in each of the uneven layer and the porous metal layer, to produce the metal member suitable for being joined to the different member.

According to a third aspect of the present disclosure, a composite includes the metal member, for example, according to the first aspect of the present disclosure, and a resin member provided in contact with the uneven layer and the porous metal layer of the metal member. The resin member enters into the holes.

Thereby, the resin member joined to the metal member including the uneven layer having an uneven shape and the porous metal layer having holes on the uneven layer exhibits an anchor effect with each of the uneven layer and the porous metal layer, which provides the composite having higher adhesiveness than that of a composite including a conventional metal member and a resin member.

According to a fourth aspect of the present disclosure, a method, which is for producing a composite including a metal member and a resin member, includes providing a metal substrate having one surface and made of a metal material, irradiating the one surface of the metal substrate with a pulse-oscillated laser beam having an energy density of less than 300 J/cm$^2$ with a pulse width of less than 1 µs to melt or evaporate the one surface, solidifying the melted or evaporated region of the one surface to form an uneven layer having an uneven shape from the one surface, reattaching the evaporated metal substrate to the inside and outside of the melted or evaporated region of the one surface to form a porous metal layer having a mesh-like shape on the uneven layer, thereby producing the metal member, and causing a flowable resin material to flow onto the one surface on which the uneven layer and the porous metal layer are provided, and thereafter curing the flowable resin material to form the resin member joined to the metal member on the one surface.

Thereby, the metal member including the uneven layer having an uneven shape and the porous metal layer having holes on the uneven layer can be produced. The metal member and the resin member are joined to each other, which makes it possible to produce the composite having higher adhesiveness than that of the composite including a conventional metal member and a resin member.

What is claimed is:

1. A metal member comprising:
a metal substrate having one surface, made of a metal material, and having a region formed as an uneven layer having an uneven shape with respect to the one surface; and
a porous metal layer having a mesh-like shape and formed on the uneven layer, wherein:
the uneven layer includes a plurality of protrusions protruding in a direction normal to the one surface;
the protrusions included in the uneven layer have an average height of less than 100 µm; and
when a direction normal to a tangent with respect to an uneven surface as a boundary surface of the uneven layer with the porous metal layer is defined as an uneven normal direction, a thickness of the porous metal layer in the uneven normal direction is less than 1 µm.

2. The metal member according to claim 1, wherein:
the porous metal layer has a plurality of holes;
the plurality of holes are formed so as to be connected to each other in a mesh form; and
a part of the plurality of holes are formed so as to extend to an outermost surface of the porous metal layer at a plurality of places.

3. The metal member according to claim 2, wherein
when an optional direction on a plane parallel to the tangent is defined as an uneven tangent direction, a maximum width dimension of the plurality of holes on the outermost surface in the uneven tangent direction is less than 100 nm.

4. The metal member according to claim 1, wherein
the metal material contains a low melting point metal material having a melting point of lower than 1000° C. or an alloy of the low melting point metal material.

5. The metal member according to claim 1, wherein
the uneven layer and the porous metal layer are made of an oxide of the metal material.

6. A method for producing a metal member, the method comprising:
providing a metal substrate having one surface and made of a metal material;
irradiating the one surface of the metal substrate with a pulse-oscillated laser beam having an energy density of less than 300 J/cm$^2$ with a pulse width of less than 1 µs to melt or evaporate a part or whole of the one surface;
solidifying the melted or evaporated region of the one surface to form an uneven layer having an uneven shape from the one surface; and
reattaching the evaporated metal substrate to the inside and outside of the melted or evaporated region of the one surface to form a porous metal layer having a mesh-like shape on the uneven layer.

7. The method for producing the metal member according to claim 6, wherein
in providing the metal substrate, the metal material contains a low melting point metal material having a melting point of lower than 1000° C. or an alloy of the low melting point metal material.

8. The method for producing the metal member according to claim 6 wherein
in irradiating with the laser beam, when a diameter of a circular laser irradiated region irradiated with the laser beam is defined as an irradiation diameter, and a distance between circle centers of the adjacent laser irradiated regions is defined as an irradiation pitch, the irradiation diameter is larger than the irradiation pitch.

9. A composite comprising:
the metal member according to claim 1; and
a resin member provided in contact with the uneven layer and the porous metal layer of the metal member, wherein
the resin member enters into the holes.

10. The composite according to claim 9, wherein:
the composite is a mold package including a substrate having a front surface and a back surface in a front-back relationship, an electronic component mounted on the front surface, a heat dissipation plate connected to the back surface and made of a metal material, and a molded resin sealing a surface connected to the substrate among the front surface, the electronic component, and the heat dissipation plate;
the metal member of the composite is the heat dissipation plate;
the resin member of the composite is the molded resin; and the uneven layer and the porous metal layer are formed in a region forming a boundary surface of the metal member with the resin member.

11. The composite according to claim 9, wherein:
the composite is a semiconductor device in which a power module and a heat dissipation fin are thermally connected via a joining material;
the metal member of the composite is the heat dissipation fin;
the resin member of the composite is the joining material; and
the uneven layer and the porous metal layer are formed in a region of the metal member connected to the resin member.

12. A method for producing a composite including a metal member and a resin member, the method comprising:
providing a metal substrate having one surface and made of a metal material;
irradiating the one surface of the metal substrate with a pulse-oscillated laser beam having an energy density of less than 300 J/cm$^2$ with a pulse width of less than 1 μs to melt or evaporate the one surface;
solidifying the melted or evaporated region of the one surface to form an uneven layer having an uneven shape from the one surface;
reattaching the evaporated metal substrate to the inside and outside of the melted or evaporated region of the one surface to form a porous metal layer having a mesh-like shape on the uneven layer, thereby producing the metal member; and
causing a flowable resin material to flow onto the one surface on which the uneven layer and the porous metal layer are provided, and thereafter curing the flowable resin material to form the resin member joined to the metal member on the one surface.

13. The method for producing the composite according to claim 12, wherein
in providing the metal substrate, the metal material contains a low melting point metal material having a melting point of lower than 1000° C. or an alloy of the low melting point metal material.

14. The method for producing the composite according to claim 12, wherein
in irradiating with the laser beam, when a diameter of a circular laser irradiated region irradiated with the laser beam is defined as an irradiation diameter, and a distance between circle centers of the adjacent laser irradiated regions is defined as an irradiation pitch, the irradiation diameter is larger than the irradiation pitch.

* * * * *